United States Patent [19]
Wagner et al.

[11] Patent Number: 5,187,450
[45] Date of Patent: Feb. 16, 1993

[54] VOLTAGE CONTROLLED OSCILLATOR SUITABLE FOR COMPLETE IMPLEMENTATION WITHIN A SEMICONDUCTOR INTEGRATED CIRCUIT

[75] Inventors: Gary L. Wagner, Menlo Park; Eric B. Rodal, Cupertino; Chung Y. Lau, Sunnyvale, all of Calif.

[73] Assignee: Trimble Navigation Limited, Sunnyvale, Calif.

[21] Appl. No.: 851,195

[22] Filed: Mar. 13, 1992

[51] Int. Cl.$^5$ .......................... H03B 5/12; H03B 5/18; H03L 7/099
[52] U.S. Cl. .................................. 331/96; 331/36 C; 331/108 C; 331/117 R; 331/117 D; 331/177 R
[58] Field of Search ................ 331/36 R, 36 C, 96, 331/108 C, 113 R, 117 R, 117 D, 177 R, 177 V

[56] References Cited
U.S. PATENT DOCUMENTS 3,382,457  5/1968  Conway ........................... 331/177 R
3,691,475  9/1972  Mouri et al. ....................... 331/20 X

*Primary Examiner*—David Mis
*Attorney, Agent, or Firm*—Thomas E. Schatzel

[57] ABSTRACT

An embodiment of the present invention is a voltage controlled oscillator (VCO) comprised of a differential pair of transistors that have respective positive feedback paths with phase-lead networks cross-coupled. Each positive feedback path on each side has two different phase-lead branches. The two phase-lead branches have the same phase differences on each side of the differential pair, in order to maintain a symmetry that improves common-mode noise rejection on a voltage control differential input. Current-steering is used to control the mixture of currents that arrive at the bases of the differential transistor pair from the respective two different phase-lead branches, and thereby changing the frequency of the VCO.

6 Claims, 2 Drawing Sheets

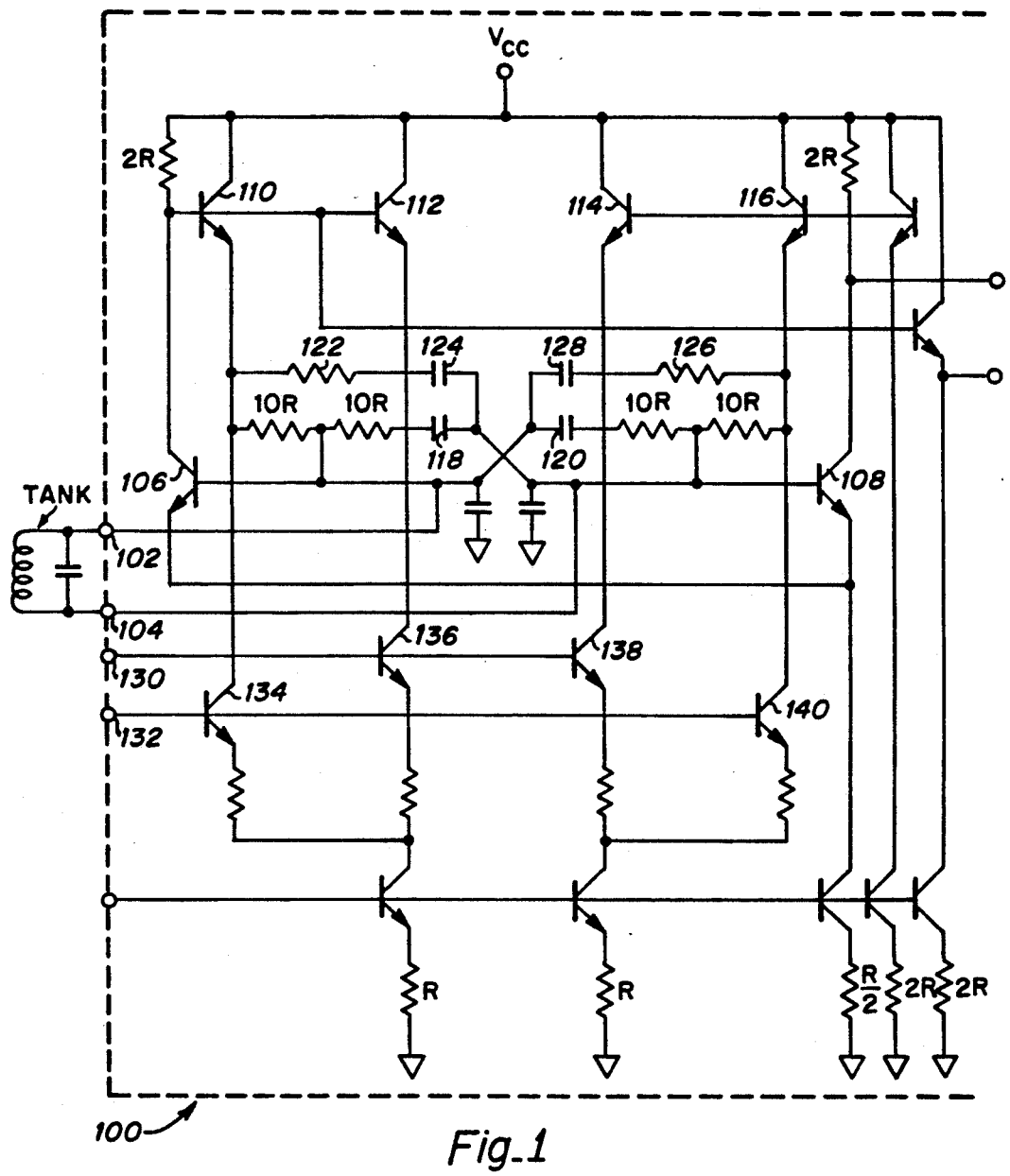
Fig_1

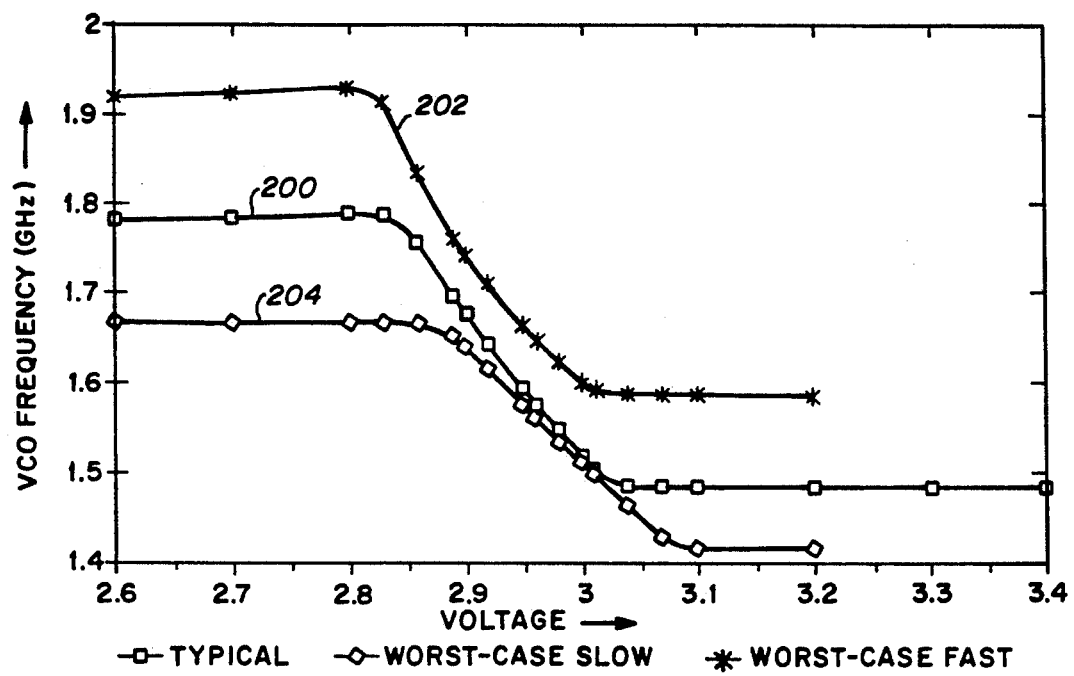
Fig_2

VOLTAGE CONTROLLED OSCILLATOR SUITABLE FOR COMPLETE IMPLEMENTATION WITHIN A SEMICONDUCTOR INTEGRATED CIRCUIT

BACKGROUND OF THE INVENTION

1. Field of the Invention

The invention relates generally to voltage controlled oscillators (VCOs) and specifically to VCO circuitry that can be completely fabricated within a semiconductor integrated circuit and that does not use a voltage-variable capacitor (varactor) for its tuning.

2. Description of the Prior Art

Astable circuits such as oscillators find many valuable uses in various kinds of electronic equipment. The simplest and most traditional of oscillators uses an inductor (L) and a capacitor (C) in an LC tank circuit with an amplifier to overcome inescapable circuit losses that would otherwise dampen any oscillations in the LC tank. The frequency of oscillation depends on the circuit inductance (inductor L plus stray inductances Ls) and the circuit capacitance (capacitor C plus stray capacitances Cs). The general formula relating frequency to inductance and capacitance is:

$$f = \frac{1}{2\pi \sqrt{LC}}$$

It is therefore obvious that high frequencies require smaller values of inductance and capacitance. At low frequencies, such as those used in AM radio, the stray reactances (Ls and Cs) are insignificant. But at high frequencies, such as those used for VHF television broadcasting, the stray reactances (Ls and Cs) are relatively large and a source of problems.

The frequency accuracy and stability of LC oscillators is not very good. Inductors and capacitors are basically coils of wire and plates separated by dielectric, respectively. Close tolerance devices are expensive to produce but still have accuracies not much better than one percent. Thermal and long term stability are also major problems.

More accurate frequencies are generated by crystal oscillators where the piezoelectric effect of a cut crystal is used to source a weak frequency signal that is built-up by an amplifier. Crystal oscillators have the advantage of very accurate and stable frequency operation, but are difficult to tune to other frequencies because the crystal cannot be reactively pulled off its natural frequency by more than a few fractions of a percent.

Frequency synthesis with phase locked loops (PLLs) involves a type of oscillator that has crystal oscillator accuracy and stability, and yet can be digitally tuned to a wide range of frequencies. Most modern radios, televisions, and communications equipment use frequency synthesis. A fixed frequency crystal oscillator is used in a synthesizer to generate a reference frequency. A phase detector compares the reference frequency to the output of a voltage controlled oscillator after being divided down by a digital counter. The output of the phase detector is amplified and integrated for use as a control to the VCO. The output of the VCO will lock onto a harmonic "N" of the reference frequency, where "N" is the count value of the digital divider.

Prior art VCOs have commonly employed a voltage variable capacitor (varactor) to control with a voltage the capacitance of an oscillator. The varactors are typically semiconductor devices that reverse bias a PN junction and use the fact that the depletion zone at the junction will increase with voltage and thereby decrease the electrode capacitance across the reversed bias PN junction.

In general, VCOs may be described as second order circuits. This means that prior to saturation or steady state operation, the VCO has a linear feedback circuit that may be described by a second order differential equation. The solution of this equation may be written as:

$$V(t) = A^* \sin(wt + \phi) \exp(-\alpha t)$$

Close examination of this result shows that to build an oscillator, the constant $\alpha$ must be negative. When it is negative, the solution is a sinewave of exponentially growing magnitude. Any noise within the circuit (at startup) will provide a seed for oscillation to commence. The oscillations build in amplitude until transistors used in the oscillator to provide amplification start to saturate or cut-off. Then the gain attains its limits, which results in a steady output of sinusoidal oscillation having a constant amplitude.

For term $\alpha$ to be a negative, the equivalent admittance within the oscillator must also be negative. This can be done by using positive feedback. In a practical circuit, an amplifier is constructed with positive gain. A portion of the output of the amplifier is routed back to its input, for example, through a resistor. Given that the gain G is greater than unity and has a zero degree phase shift, the input admittance Y can be written:

$$Y = -\frac{(G-1)}{R}.$$

In practical oscillators running at frequencies above one gigahertz, any amplifier used will have some phase shift associated with its circuitry, and that unavoidably produces a phase delay, or phase-lag. Such a phase-lag in the amplifier can be compensated for in the feedback circuit by using a phase-lead circuit. Capacitors produce a phase-lead, so the feedback circuit will typically comprise a resistor-capacitor (RC) combination.

Mobile/portable radio communication units are limited in the size and weight of devices they can incorporate. Integrated circuit techniques have been used in countless applications to put all or nearly all of the circuit components on a single chip. However, inherent IC processing variations can produce troublesome deviations in resistance, capacitance or other important characteristics, particularly in sensitive circuits such as VCOs. These deviations can dramatically affect the frequency accuracy and operational noise levels of VCOs that have been incorporated into an IC. Low-noise VCOs, subject to precision high-frequency requirements, have traditionally required very tight IC processing control. Such manufacturing control makes these VCOs very expensive to produce.

A robust VCO circuit design and implementation is needed that is relatively immune to IC processing variations, and yet produces a quality, low-noise VCO that is viable at gigahertz frequencies and does not require inductors or varactors on or off the chip.

SUMMARY OF THE PRESENT INVENTION

It is therefore an object of the present invention to provide a voltage controlled oscillator with low noise and accurate frequency tuning capability while allowing greater integrated circuit (IC) processing tolerances.

It is another object of the present invention to provide a VCO which can be smoothly and monotonically tuned whereby the VCO can be used over a broad bandwidth.

It is a further object of the present invention to provide a VCO that can be manufactured at low cost and yet yield high-quality performance above one gigahertz.

It is a further object of the present invention to provide an varactorless VCO which is operable at a frequency above one gigahertz.

Briefly, an embodiment of the present invention is a VCO comprised of a differential pair of transistors that have respective positive feedback paths with phase-lead networks cross-coupled. Each positive feedback path has two different phase-lead branches. The two phase-lead branches are the same on each side of the differential pair to maintain a symmetry that improves common-mode noise rejection on a voltage controlled differential input. Current steering is used to control a mixture of currents arriving at the bases of the differential transistor pair from the respective two different phase-lead branches.

An advantage of the present invention that except two short circuit stubs for external voltage connections, the entire circuitry of the oscillator may be formed by IC process on a substrate.

Another advantage of the present invention is that the frequency of the oscillator output can be accurately tuned by adjusting the ratio of currents flowing through a pair of steering circuits whereby the output frequency of the oscillator can be accurately tuned and become less sensitive to circuit parameters thus allowing greater IC processing tolerances.

A further advantage of the present invention is that it provides a VCO that is varactorless and can be monotonically and smoothly tuned over a broad range of bandwidth.

A further advantage of the present invention is that it provides an inductorless VCO that has very low noise level at an above-GHz frequency so that it can be used in a mobile/portable RF communication system.

These and other objects and advantages of the present invention will no doubt become obvious to those of ordinary skill in the art after having read the following detailed description of the preferred embodiment which is illustrated in the various drawing figures.

IN THE DRAWINGS

FIG. 1 is a schematic diagram of an embodiment of the present invention and is a VCO that uses a single external tank circuit; and FIG. 2 is a plot of frequency response of a VCO according to the present invention that was generated by a circuit simulation analysis.

DETAILED DESCRIPTION OF THE PREFERRED EMBODIMENTS

FIG. 1 is a voltage controlled oscillator (VCO), referred to by the general reference number 100. VCO 100 is comprised of a pair of terminals 102 and 104 for connection to an external tank circuit (TANK), a pair of differential transistors 106 and 108, and a plurality of transistors 110, 112, 114 and 116. To maintain the symmetrical balance of VCO 100, such feedback networks use similar components and are controlled in parallel. A first positive feedback signal is routed from the emitter of transistor 112 through a capacitor 118 that provides a phase-lead to the base of transistor 108. A second positive feedback signal is routed from the emitter of transistor 114 through capacitor 120 to provide a phase-lead to the base of transistor 106. Capacitors 118 and 120 have the same value and so provide substantially the same phase-lead positive feedback through their respective branches. The emitter of transistor 110 is connected to a resistor 122 and a capacitor 124 which are in series and comprise a phase-lead network to the base of transistor 108. The emitter of transistor 116 is similarly connected to a resistor 126 and a capacitor 128, which are in series, and comprise a phase-lead network to the base of transistor 106. Resistors 122 and 126 are the same as are capacitors 124 and 128, so they also provide substantially the same phase-lead positive feedback through their respective branches. However, this phase-lead is substantially different from that provided through capacitors 118 and 120. In a Constructed experimental prototype of VCO 100, a center frequency of about 1.57 gigahertz was obtained, capacitors 118 and 120 were chosen to be sixty femtofarads, resistors 122 and 126 were 800 ohms, and capacitors 124 and 128 were chosen to be 360 femtofarads. The external TANK circuit comprised a U-shaped stub of conductive trace on a printed circuit board approximately three-eighths of an inch long and approximately an eighth of an inch wide. The center operating frequency of VCO 100 can be changed by increasing or decreasing the length and/or the width of such a stub used for an external tank. The external tank configuration allows user tuning of the center frequency and permits the oscillator to be externally driven. Preferably, the circuitry of VCO 100, except the external tank circuit, is fabricated on a single integrated circuit.

When there is no external voltage difference being applied between a pair of voltage control terminals 130 and 132, the current through the series combination of transistor 110 and a transistor 134, and series combination of transistor 112 and a transistor 136 should be substantially equal. Also, the current through the series combination of transistor 114 and a transistor 138, and series combination of transistor 116 and a transistor 140 should also be substantially equal. Given that condition, the amount of feedback appearing at the emitters of transistors 110 and 112 from the collector of transistor 108, and the amount of feedback appearing at the emitters of transistors 114 and 116 from the collector of transistor 106, will be substantially equal.

Thus the reactance currents through capacitors 124 and 128 will be substantially the same, as are the reactance currents through capacitors 118 and 120. An imbalance in this situation will occur favoring the reactance currents through capacitors 124 and 128 or favoring the reactance currents through capacitors 118 and 120 if a differential voltage is applied between terminals 130 and 132. The varying composition of the reactive components in the combined positive feedback will cause the frequency of operation of VCO 100 to vary accordingly. Since such a change is induced by a differential voltage on terminals 130 and 132, the function of a voltage controlled oscillator is thus accomplished.

The above tuning mechanism of VCO 100 provides good noise immunity, since common-mode voltages simultaneously appearing on 130 and 132 will cancel, and therefore not affect the distribution of currents. There is therefore, a high degree of noise immunity.

FIG. 2 shows the simulated results with an additional amplifier ahead of the VCO which has a single input and a differential output. A linear voltage to frequency control region was observed between 2.8 volts and 3.1 volts input, as represented by a curve 200. In VCO 100, this control input voltage would necessarily be differentially applied across terminals 130 and 132 and would not necessarily have the same input scale or offset as shown in FIG. 2. A center frequency of approximately 1.57 GHz resulted at 2.95 volts. The transition from minimum to maximum frequency was smooth and showed a good dynamic frequency range ($f_\Delta$) of 0.250 GHz. A curve 202 shows the worst-case-fast limit of curve 200 for a reasonable amount of component tolerances that could be expected. Similarly, a curve 204 shows the worst-case-slow limit of curve 200 for a reasonable amount of component tolerances that could be expected. Both curves 202 and 204 show that they have the area around 1.6 GHz in common and also have about the same slope and differential frequency sweep as curve 200.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A voltage controlled oscillator (VCO), comprising:
    a single tank circuit;
    a differential amplifier transistor pair having inputs coupled to the tank circuit;
    a first pair of positive feedback networks having a first phase-lead reactance and with one of each of the pair cross-connected to the differential amplifier transistor pair;
    a second pair of positive feedback networks having a second phase-lead reactance and with one of each of the pair cross-connected to the differential amplifier transistor pair;
    a plurality of current-steering transistors; and
    a differential input coupled to the plurality of current-steering transistors to control the mixture of positive feedback signals from the first and second pairs of positive feedback networks and the operating frequency of the VCO is controlled in relation to a difference-mode signal on the differential input.

2. The VCO of claim 1, wherein:
    the differential amplifier transistor pair, the first and second pair of positive feedback networks, and the differential input are all integrated into an integrated circuit (IC); and
    the single tank circuit is comprised of a trace on a printed circuit to which said IC is attached.

3. The VCO of claim 1, wherein:
    the differential amplifier transistor pair comprises two NPN transistors with their emitters tied together.

4. The VCO of claim 3, wherein:
    the first and second pair of positive feedback networks comprise first and second capacitors having substantially different values, one each of said first and second capacitors being connected to each base of the differential amplifier transistor pair.

5. The VCO of claim 4, wherein:
    the plurality of current-steering transistors are connected with said first and second capacitors coupled to respective outputs of the differential amplifier transistor pair.

6. The VCO of claim 1, wherein:
    a differential input voltage applied to the differential amplifier transistor pair will cause a phase shift through the positive feedback networks that is smoothly and continuously variable.

* * * * *